(12) United States Patent
Gotsmann et al.

(10) Patent No.: US 7,906,887 B2
(45) Date of Patent: Mar. 15, 2011

(54) MICROSYSTEM AND METHOD FOR POSITIONING A SECOND ELEMENT WITH RESPECT TO A FIRST ELEMENT IN A MICROSYSTEM

(75) Inventors: Bernd Gotsmann, Horgen (CH); Michel Despont, Au (CH); Urs T. Duerig, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 696 days.

(21) Appl. No.: 11/577,331

(22) PCT Filed: Sep. 29, 2005

(86) PCT No.: PCT/IB2005/003037
§ 371 (c)(1), (2), (4) Date: Jan. 28, 2008

(87) PCT Pub. No.: WO2006/040654
PCT Pub. Date: Apr. 20, 2006

(65) Prior Publication Data
US 2008/0258577 A1 Oct. 23, 2008

(30) Foreign Application Priority Data
Oct. 14, 2004 (EP) ..................... 04405640

(51) Int. Cl.
*H02N 10/00* (2006.01)
(52) U.S. Cl. .......... 310/306; 310/309; 310/311; 310/328
(58) Field of Classification Search .......... 310/306, 310/307
See application file for complete search history.

(56) References Cited

U.S. PATENT DOCUMENTS

| | | | |
|---|---|---|---|
| 5,338,997 A * | 8/1994 | Benecke | 310/307 |
| 6,313,562 B1 * | 11/2001 | Barnes et al. | 310/306 |
| 6,844,657 B2 * | 1/2005 | Miller et al. | 310/311 |
| 7,495,368 B2 * | 2/2009 | Gogoi et al. | 310/300 |

* cited by examiner

*Primary Examiner* — Mark Budd
(74) *Attorney, Agent, or Firm* — William Stock; Anne Vachon Dougherty

(57) ABSTRACT

A microsystem, comprising a first static element (1), a second, movable and unattached element (2), an actuator (3) for effecting a force between the first and the second element (1, 2), which actuator (3) is designed for controlling a temperature (T1, T2) of one of the first element (1) and the second element (2). A corresponding method for positioning a second element (2) with respect to a first element (1) in a microsystem is introduced.

24 Claims, 6 Drawing Sheets

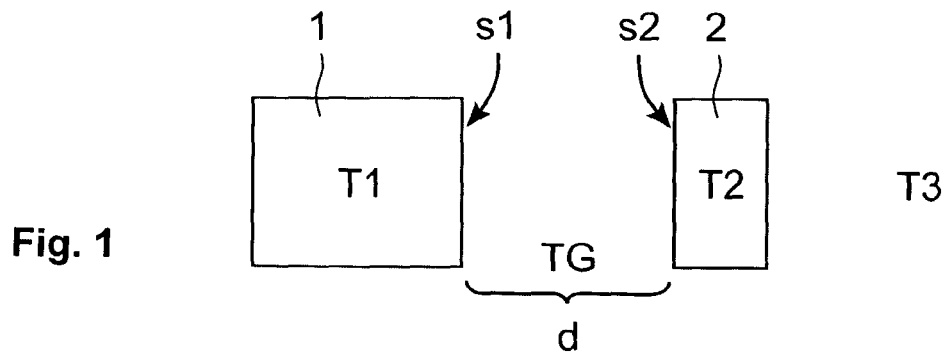
Fig. 1
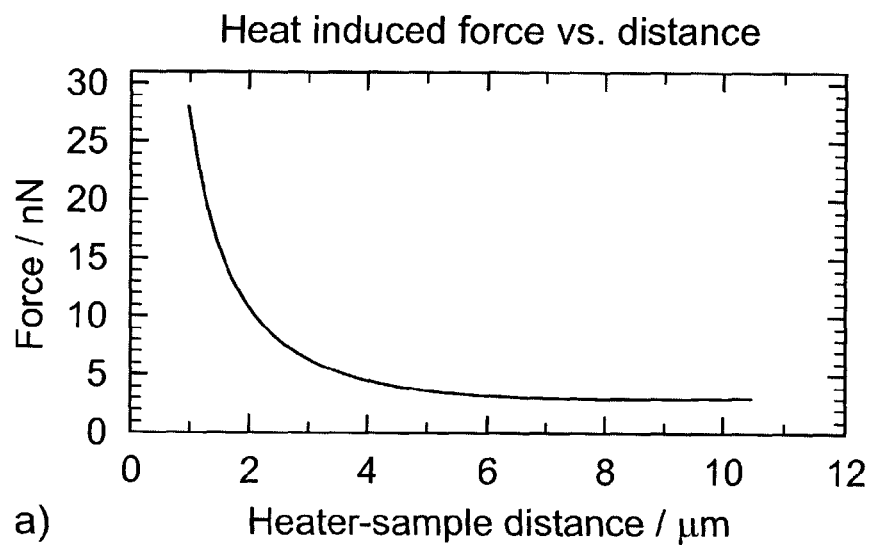
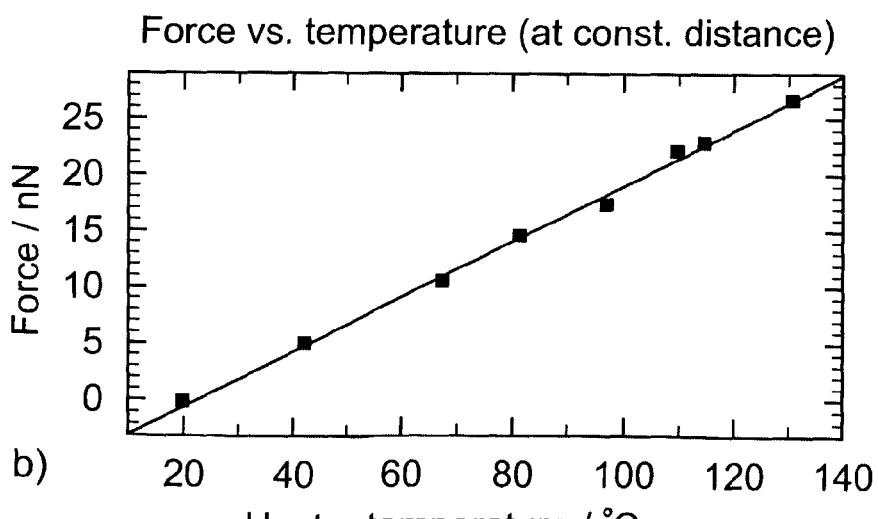
Fig. 2

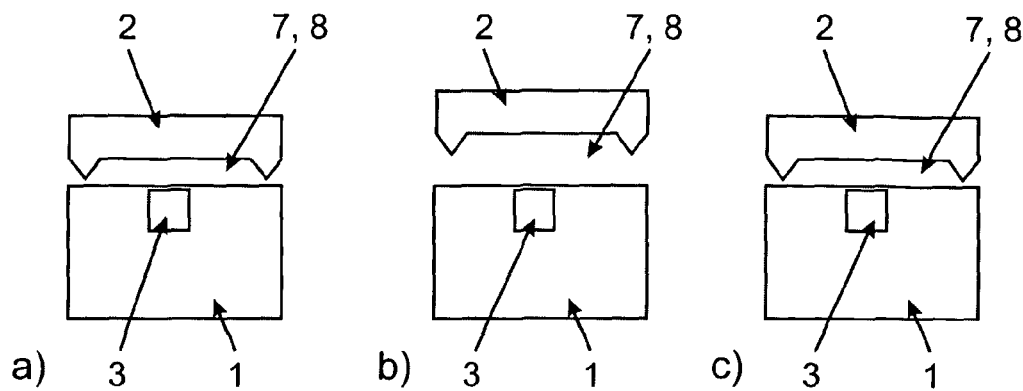
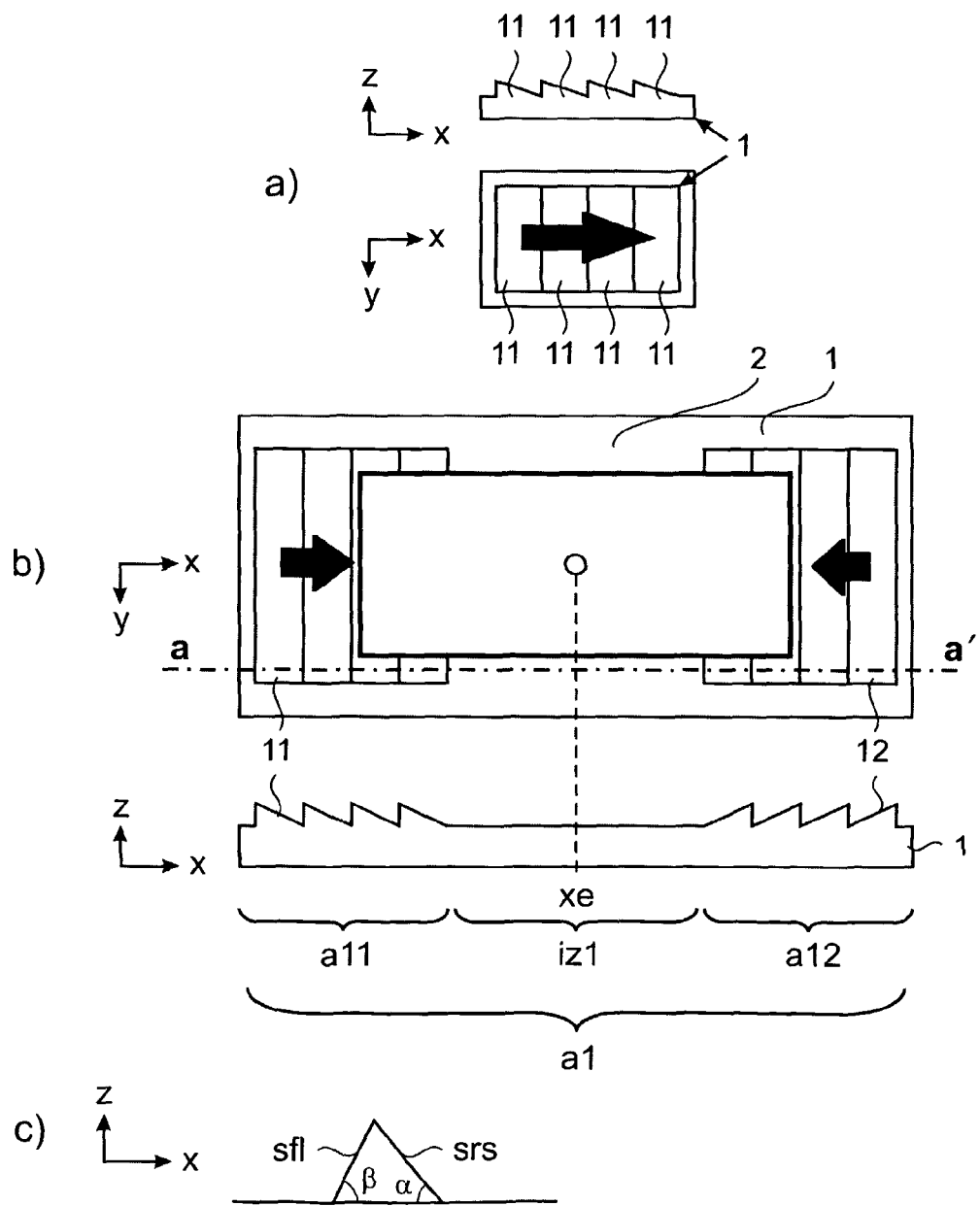
Fig. 5

MICROSYSTEM AND METHOD FOR POSITIONING A SECOND ELEMENT WITH RESPECT TO A FIRST ELEMENT IN A MICROSYSTEM

FIELD OF THE INVENTION

The invention relates to a microsystem and a method for positioning a second element with respect to a first element in a microsystem.

BACKGROUND OF THE INVENTION

A difficult problem of microsystems is inducing and controlling forces. In particular, it is desired to reduce friction forces between two elements of a microsystem moving with respect to each other.

In general, there are several methods to actuate elements of micrometer dimensions on micrometer scales:

An electrostatic force can be asserted. However, the movable element would need to provide a mechanical/electrical contact to a voltage source. Moreover, the electrostatic force is an attractive one in most cases. It is difficult to induce a repulsive actuation force based on electrostatic actuation.

A magnetic force can be asserted: Again, the movable element would need to provide either a mechanical/electrical contact or comprise a magnetic particle. The requirement for a coil and a magnetic particle adds complexity to the system. Additionally, it is rather difficult to set up magnetic field conditions such that movements on a micrometer scale can be controlled.

The movable element could also be mechanically coupled to a mechanical actuator such as a piezo actuator. Of course, the movable element would need to provide a mechanical contact.

"Knudsen forces on microcantilvers", A. Passian et al., Journal of Applied Physics, Volume 92, Number 10, pages 6326-6333, 15 Nov. 2002, and "Thermal Transpiration at the Microscale: A Crookes Cantilever", A. Passian et al., Physical Review Letters, Volume 90, Number 12, 28 Mar. 2003, both show the occurrence of Knudsen forces in a microsystem between two surfaces at different temperatures which one surface belongs to a microcantilever and the other surface belongs to a sample substrate. The microcantilever is attached to the sample substrate. Both documents are referred to in the following as "Passian et al.".

For an application where a movable element shall be actuated and cannot have a mechanical contact or a magnetic particle attached and at least a repulsive force shall be generated, no solution is known.

SUMMARY OF THE INVENTION

According to a first aspect of the present invention, there is provided a microsystem comprising a first static element, a second movable and unattached element, and an actuator for effecting a force between the first element and the second element, which actuator is designed for controlling a temperature of one of the first element and the second element.

In a microsystem, a mechanism is described for inducing a force between two elements by heating or cooling one of the elements to a temperature different than a temperature of the other element. As the second element is both movable and unattached, such second element can be actuated without the need for an electrical contact or a mechanical contact to such movable element. As the system is specified as a microsystem, the movable element is of micrometer dimensions or below. The movable element is unattached, i.e. it is free and not attached or fixed to the first static element or to another static element of the microsystem. "Attached" or "fixed" in this context means that a mechanical connection between any static and the movable element exists and would affect the positioning of the movable element during operation. Vice versa, any mechanical connection between any static element of the microsystem and the movable element which does not affect the positioning of the movable element during operation—such as may be, for example, some fine bonding which only serves for electrically connecting the movable element—does not qualify as an attachment: Such second element remains unattached. Further, any static structures being integral part of or fixed to the static element which structures can e.g. be bumpers, spacers, support structures, etc., and which structures are not mechanically connected to the movable element but which might get into contact with the movable element during operation e.g. for limiting the movement of the movable element in one or the other direction do not qualify as attachment to the movable element either as there is actually no fixture or attachment between the static and the movable element. Also, as long as any further element is attached to the second element and is movable together with the second element, the second element remains unattached with respect to any static element as such further element does not qualify as static element. As the case may be, such entirety of jointly movable elements would then qualify as second, movable and unattached element.

By way of heating or cooling one or both of the elements forces are thermally induced between the first and the second element. Depending on the temperatures of the elements, the thermal forces can be of repulsive or of attractive nature. In particular, when repulsive forces are induced the movable element can be brought out of contact from the static element. Generally, by way of inducing forces between the first and the second element the second element can be positioned with respect to the first element.

Thermally induced forces on elements of a microsystem including one of the elements being a movable and unattached element show multiple benefits: First of all, the microsystem as proposed is simple to manufacture. Standard microfabrication techniques can be used. There is large freedom of choice for the properties of the movable element. Further, no mechanical or electrical contact is needed for the movable element. Attractive and repulsive forces can be generated. No high voltages are needed to operate a suitable actuator. Thermal actuators are easy to integrate into a microsystem. The forces induced are distance dependent. A transient behavior with decay length of the order of some micrometers can be observed.

In combination with a second force such as a spring, gravity, electrostatic attraction etc., the distance between the elements can be controlled. The microsystem as proposed can work power efficient because the thermal capacity of micrometer-sized elements is relatively small. Any positioning of the second element with respect to the first element can be done fast: Experimental data show a response time below 10 microseconds. A temperature difference between the two elements is relatively easy to produce in an accurate and reproducible way. In contrast to the temperature difference, however, the effect is not expected to depend strongly on the absolute temperature and pressure, which can be allowed to drift.

The actuator is preferably embodied as a heater or as a cooler. A heater actuator for example can heat the temperature of the second movable element to a temperature above the temperature of the first static element. In case the first element is neither heated nor cooled but takes room temperature, then heating of the second element above room temperature causes repulsive thermal forces acting on the second element. The same effect can be obtained when the second element is neither heated nor cooled but shows room temperature and the first element is cooled to a temperature below room temperature.

Attractive forces between the two elements of the microsystem can be generated when the actuator cools the temperature of the second element to a temperature below the temperature of the first element. In the event the first element shows room temperature, then the cooler cools the temperature of the second element below room temperature in order to generate an adhesive force. Alternatively, an attractive force can be generated when the temperature of the first element is heated to a temperature above the temperature of the second element. If the second element shows room temperature, the first static element is heated to a temperature above room temperature in order to induce adhesive forces.

In particular, when repulsive forces shall be generated, it is preferred to arrange the microsystem in such way that counter-forces such as gravity act on the second element in addition to the thermally induced forces. If, for example, the second element is arranged above the first element with respect of the direction of gravity, in an operation mode the thermally induced repulsive forces counteract the gravity forces. The operation mode is understood as mode in which the actuator is operated. In an equilibrium condition, the second element floats above the first element without contact to the first element.

In a preferred embodiment, there are means provided for stabilizing a floating state of the second element in an operation mode. Such means can be represented by a mechanical element of the microsystem for supporting the second element in a contact mode, however, without the second element being attached to such stabilizing means. Such means can be represented by additionally induced forces. Such additionally induced forces can also be thermally induced or otherwise induced. Such additionally induced forces preferably help the second element to maintain its lateral position once lifted from the first element in a vertical direction. Thus, such additionally induced forces preferably act on the second element in lateral direction. However, such additionally induced forces can also act vertically on the second element in order to additionally support the second element. In some very preferred embodiments explained further below, means are introduced for generating thermally induced force components acting laterally on the second element in an operation mode.

It is not needed to heat or cool the entire first or second element. In certain applications, the actuator heats or cools only one or more limited zones of the respective element. For example, if the second element is shaped in form of a bar only the end sections of the bar can represent a temperature controlled zone that is heated or cooled. In such application, it is not necessarily assumed that the entire bar shows excellent heat transfer properties in order to achieve an even distribution of heat across the element when injecting heat only punctually. A temperature controlled zone can also be thermally isolated from the rest of the element. Injecting heat in such thermally isolated zones can be sufficient to generate the desired forces. Generally, a zone of the other element facing such temperature controlled zone is referred to as actuation zone. Interaction between a temperature controlled zone and an actuation zone generates the desired forces due to a temperature gradient across these zones. A plurality of actuation zone—temperature controlled zone combinations is preferred to control a position of the second element. The position of the second element can then be influenced, maintained or modified by radiating one or more selected ones of the temperature controlled zones and thus by operating one or more of the temperature controlled zone—actuated zone combinations. It is the characteristic of temperature controlled zones that they can simultaneously be controlled to take different temperatures.

In a preferred embodiment, the actuator is mounted on the first element. Even if mounted on the first element, the actuator can be designed for controlling the temperature of the second element. Then, the actuator is preferably thermally isolated from the first element and provides a high thermal conductivity with respect to the second element. Preferably, the actuator is not arranged in contact with the second element in an operation mode but transfers heat or cold in a contactless way. This feature is in particular preferred if repulsive forces shall be induced during the operation mode.

However, also both of the elements can be subject to heating or cooling. This embodiment is based on the consideration that it might be preferred to control the temperature of both of the elements instead of exposing one of the elements to room temperature.

It is preferred to operate the microsystem with a distance between the first element and the second element smaller than 100 ⨯ in such operation mode. The operation mode is understood as mode in which the actuator is operated. Experiments show that in the range given, a bigger magnitude of forces can be expected than at distances above this range. In another preferred embodiment, the distance between the first element and the second element is smaller than 10 ⨯ in an operation mode. In a very preferred embodiment of the invention, the distance between the first element and the second element is smaller than 5 ⨯ in an operation mode.

Preferably, surfaces of the elements facing each other are aligned substantially in parallel. Substantially in parallel shall include a range of =/−10° degrees. Such surfaces cause the forces induced be oriented perpendicular to the surfaces, also referred to vertical orientation. Such alignment of surfaces is preferred for e.g. lifting the second element with respect to the first one. Preferably, the surfaces of the elements facing each other do not comprise any section not being in parallel.

According to another embodiment of the present invention, however, at least one of the surfaces of the elements facing each other comprises at least one section inclined towards the other surface. As in general the thermal force acts perpendicular on the facing surfaces of the elements a lateral force component can be introduced by providing an angle between facing surface sections.

Any indication about the orientation of facing surfaces of the elements refer to a microsystem in operation. The design of the overall microsystem is relevant for bringing the second element into a stable state. In case of inducing repulsive forces, at least one parallel section of facing surfaces is a preferred means for lifting the second element. In such embodiment, another inclined section can be provided in order to generate lateral forces in addition to the vertical repulsive forces.

According to another embodiment, there is provided a support for holding the second element is a desired position in a silent mode of the microsystem. The silent mode is understood as mode in which the actuator is not operated. Such desired position predetermined by the support can also be the starting position from which the second element starts moving/repositioning as soon as the actuator is operated. Consequently, in preferred embodiments the support is designed such that the second element is aligned with respect to the first element in a position in which the surface facing the first element in the operation mode already faces the first element in the silent mode. In such embodiment, any orientation statement of facing surfaces are also valid in the silent mode.

An inclined section preferably represents an actuation zone acting together with a temperature controlled zone of the other element. However, the inclined section itself can also represent the temperature controlled zone. Hence, by selectively actuating the temperature controlled zone, a lateral force can be induced at any time desired. Such inclined section can for example be arranged between two parallel sections such that the parallel sections are used for lifting the second element while the inclined section is used for selectively moving the second element sidewards. Depending on the structure of the elements, the lifting function does not necessarily need to be turned on for enabling the lateral movement: In case the inclined section is arranged in a cavity between the two parallel sections, then the second element can be based in direct contact on the two parallel surface sections of the first element and be actuated in such position. Then, the induced lateral forces act against friction forces between the parallel surface sections acting as bearings for moving the free second element sidewards.

According to another embodiment, there are provided one or more parallel surface sections for lifting the second element with respect to the first element provided repulsive forces are induced between the first and the second element. Inclined surface sections can additionally be provided, the orientation of an inclined surface section providing the orientation for moving a lifted second element when such inclined surface section is additionally actuated. Again, in such embodiment, the concept of selectively actuating different temperature controlled zones of one of the first and the second element can be realized. In particular, the actuation zone/temperature controlled zone—combinations for lifting the second element with regard to the first element can be actuated independent from actuation zone/temperature controlled zone—combinations for moving the second element sidewards with respect to the first element.

According to a further embodiment, the functions of lifting and moving sidewards the second element with respect to the first element can be merged: In such embodiment, at least two inclined surface sections in one of the first and the second element induce forces with lateral components pointing at each other or from each other. In an equilibrium state, the second element remains centered being exposed to both of opposed lateral force components. In such equilibrium state, the opposed lateral force components preferably show the same magnitude and pointing at each other. The further vertical components of the induced forces are responsible for lifting the second element while the lateral induced forces keep the second element in the equilibrium state. Such embodiment can be implemented by two mirrored inclined surfaces in one of the elements. In between such elements, there may be provided a section with a surface parallel to the surface of the other element.

Generally, it is noted that any arrangement of different surface sections such as the arrangement of parallel and/or inclined surface sections do not need to be implemented on the same element. While a first inclined surface section can be arranged on the first element, another inclined surface section can be arranged on the second element. As it is always the first and the second element in interaction causing forces due to a temperature gradient between the elements, any orientation manipulating surface section can be embodied in one of the first and/or the second element. While many of the claims and many of the embodiments presented are directed towards the arrangement of multiple inclined surface sections on the same element, it is understood that any arrangement of such sections on each of the elements falls under the scope of these claims, in individual cases under adjustment of orientation of such elements as it is made accessible to someone skilled in the art.

The arrangement of ramps in such first or second element is preferred according to another embodiment. A ramp at least comprises an inclined surface section and thus offers all the benefits introduced in the paragraphs above with respect to inclined surface sections. For a more precise definition, a ramp is considered as a structure embodied in one or both of the elements comprising a rising and a falling surface section. The rising surface section typically shows only a slight inclination angle of $0° < \alpha < 45°$, while the falling edge shows a steep inclination angle of $75° < \alpha \leq 90°$. The inclination angle of the rising surface section is primarily determined by the lateral component of the force to be established. The falling surface section preferably shows an inclination angle of $90°$ such that is does not contribute to force generation.

When arranging multiple ramps in parallel and close to each other, such ramps preferably form a saw tooth profile. Hence, the effective surface for inducing lateral force components can be maximized. Ramps are considered to be in parallel when the rising surfaces are arranged in parallel. Ramps are considered to show the same orientation irrespective of the inclination angle $\alpha$ of the rising surfaces as long as the forces induced are oriented in the same plane.

In case multiple ramps with different orientation are provided, a ramp showing an arbitrary orientation and serving as a reference orientation for describing ramps with a different orientation is also referred to as a first ramp. Preferably, the same element or the other element comprises a second ramp which second ramp is oriented in a substantially 180° degree rotated position with respect to the first ramp. Rotation axis in the following is an axis perpendicular to parallel surfaces of the elements. This means that either the rising sections or the falling sections of these ramps face each other.

Arrangements of first and second ramps can provide a microsystem in which the second element is balanced in a centered position with respect to the first and the second ramps as the first and second ramps not only induce a force with a vertical component but also with lateral components.

In addition to a first ramp, or in addition to a first and a second ramp, a third ramp can be provided the third ramp being oriented in a substantially 90° degree rotated position with respect to the first ramp. Having arranged all three type oriented ramps on one or both of the elements, the second element balanced by means of the first and the second ramp can be moved by means of the third ramp.

In addition to a first ramp, or in addition to a first and a second ramp, or in addition to a first, a second and a third ramp, a fourth ramp can be provided the fourth ramp being oriented in a substantially 270° degree rotated position with respect to the first ramp.

A substantially rotated position includes deviations from the position as given of up to +/−10° degrees.

In a microsystem comprising all different four types of ramps, the second element can be centered when all four ramps provide forces, each two forces comprising lateral components counteracting each other.

In another microsystem comprising all four types of ramps, the second element can be rotated when all four ramps are aligned such that they provide lateral and tangential force components with respect to an axis of rotation of the second element.

In the following embodiments, it is preferred to provide ramps in an alignment. An alignment is understood as elongated arrangement of multiple ramps on an element. Preferably, at the end sections of such alignment there are provided subalignments comprising the ramps. In between the subalignments, there is provided an intermediary zone. The second element is preferably arranged with respect to the alignment such that in an operation mode at least part of the second element extends over the alignment in order to enable centering and/or balancing and/or pushing effects on the second element.

Such alignment can provide at least one first ramp in its first subalignment, and at least one second ramp in it second subalignment. The induced lateral forces then counteract and help stabilizing or balancing the second element provided the magnitude of induced lateral forces are the same for both the first and the second ramp induced lateral forces.

In another preferred embodiment, another alignment—also referred to as the second alignment—is provided. Preferably, at the end sections of such second alignment there are provided subalignments comprising the ramps. In between the subalignments, there is provided an intermediary zone. The second element is preferably arranged with respect to the second alignment such that in an operation mode at least part of the second element extends over the second alignment in order to enable centering and/or balancing and/or pushing effects on the second element.

Such second alignment can comprise in its third subalignment a third ramp and in its fourth subalignment a fourth ramp.

In case of combining the first and the second alignment, the first and the second alignment are preferably aligned with respect to each other such that their intermediary zones intersect. Preferably, each intermediary zone is a ramp-free zone.

According to the explanation given above, an alignment is considered to have an axis according to its elongation. Provided that some or all ramps of the same alignment are oriented in line with such axis of the respective alignment, ramps of the same alignment facing each other help to generate counteracting lateral force components. Such microsystem supports a self centering second element which element preferably is a plate, and in a very preferred embodiment is a disk.

Provided that some or all ramps of the same alignment are oriented substantially perpendicular—i.e. within a range of +/−10° degrees—to such axis of the respective alignment, such ramps help to generate tangential force components with respect to the second element. Such microsystem supports a rotating second element which element preferably is a plate, and in a very preferred embodiment is a disk.

By combining the features of the two latter embodiments a microsystem can be built with self-centering and rotating capabilities which capabilities can individually be actuated by heating/cooling the respective temperature controlled zones. In other words, in such microsystem the first alignment comprises in its first subalignment the first ramp and another ramp oriented according to one of the third ramp and the fourth ramp, and in its second subalignment the second ramp and another ramp oriented according to one of the third and the fourth ramp. The second alignment comprises in its third subalignment the third ramp and another ramp oriented according to one of the first ramp and the second ramp, and in its fourth subalignment the fourth ramp and another ramp oriented according to one of the first ramp and the second ramp.

According to another embodiment, a first alignment can comprise in its first subalignment not only the first ramp but also another ramp oriented according to the second ramp, and in its second subalignment not only the second ramp but also another ramp oriented according to the first ramp. Such alignment allows fine adjustment of the position of the second element in direction of the lateral forces induced. At each end section of the second element, the force in + or − lateral direction can be controlled individually. Provided, a second alignment is added which second alignment is equipped with ramps of the third and fourth type orientation accordingly, a x-y-scanner microsystem is introduced allowing a fine adjustment of the second element in an x- and y-position provided x and y indicate the lateral coordinates of the system.

It is particularly preferred, that instead of singular ramps of a particular orientation multiple ramps of that orientation are provided such set of multiple ramps forming a saw tooth profile. The inclined surface effective for inducing lateral forces can be increased.

According to another aspect of the present invention, there is provided a micropositioner, comprising a microsystem according to any one of the microsystem claims for positioning the second element with respect to the first element. In this context it is understood that any induced movement of the second element with respect to the first elements fulfills the requirements of a micropositioner.

According to another aspect of the present invention, there is provided a microlifter, comprising a microsystem according to any one of the microsystem claims for lifting the second element with respect to the first element. In a microlifter, the second element is moved with respect to the first element upor downwards.

According to another aspect of the present invention, there is provided a method for positioning a second element with respect to a first element in a microsystem, comprising controlling a temperature of one of the first element and the second element which first element is a static element and which second element is a movable and unattached element, and thereby effecting a force between the first and the second element for positioning the second element with respect to the first element.

As already introduced with regard to the microsystem, in preferred embodiments the temperature of the second element is controlled to a temperature above the temperature of the first element, or the temperature of the second element is controlled to a temperature below the temperature of the first element, or the temperature of the first element is controlled to a temperature below the temperature of the second element, or the temperature of the first element is controlled to a temperature above the temperature of the second element.

According to another preferred embodiment, the temperature of one or more zones of one of the first and the second element is controlled.

According to another aspect of the present invention, there is provided a computer program comprising program code for causing the steps of one of the claimed methods to be executed when said program is run on a processing unit. According to a further aspect of the present invention, there is provided a computer program product stored on a computer usable medium, comprising computer readable program code for causing a processing unit to perform all the steps of one of the claimed methods.

Advantages of the method, the computer program elements and their embodiments go along with the advantages of the apparatus and its embodiments as described above.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating in:

FIG. 1 a diagram of a microsystem according to the present invention,

FIGS. 2 a) and b) two charts explaining the relationship between temperature, temperature induced force and distance between elements in a microsystem according to the present invention, FIGS. 3 a) and b) two embodiments of microlifters, in accordance with the present invention, and FIG. 3 c)-g) further microsystems according to the present invention, all of them shown in cross-section, FIG. 4 a)-c) three different positions of a micropositioner, in accordance with the present invention, FIGS. 5 a) and b) two different microsystems comprising ramps, in accordance with the present invention, both in top view and cross-section, and FIG. 5 c) a single ramp in cross-section, FIG. 6 a thermal guiding microsystem in top view and cross-section, in accordance with the present invention, FIG. 7 a circular self-centering microsystem in top view and cross-section, in accordance with the present invention, FIG. 8 another circular self-centering microsystem with rotating capabilities, in accordance with the present invention, in two schematic top views according to FIGS. 8a) and 8b), in a cross-sectional view according to FIG. 8c), and in a top view according to FIG. 8d), and FIG. 9 a x-y-microscanner in top view and cross-section, in accordance with the present invention.

Figure 3:
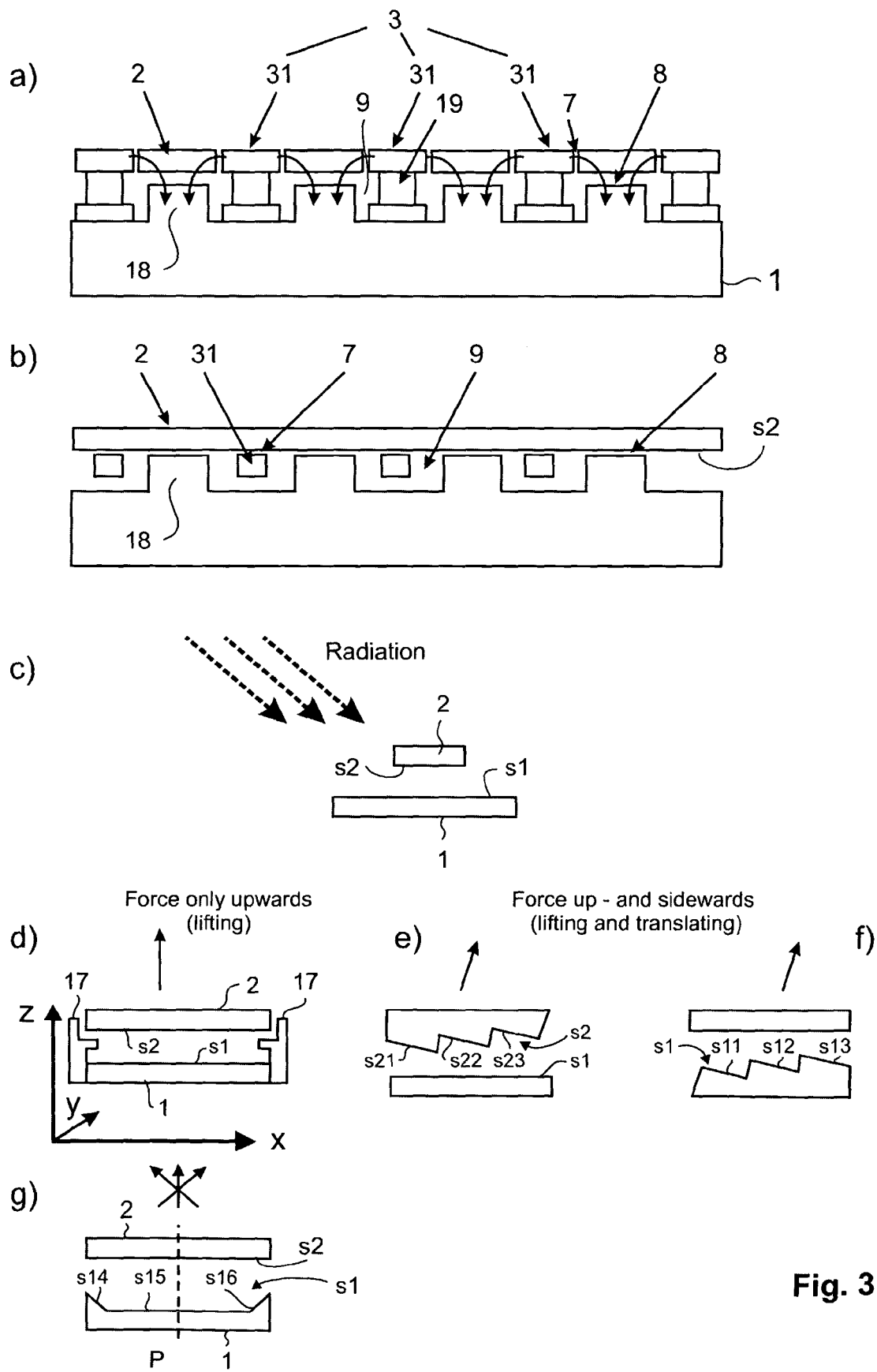

Different figures may contain identical references, representing elements with similar or uniform content.

DETAILED DESCRIPTION OF THE DRAWINGS

FIG. 1 illustrates a diagram of a basic microsystem according to the present invention. Elements 1 and 2 are separated from each other by distance d in a microsystem. The first element 1 is static in relation to the microsystem while the second element 2 is an element movable in relation to the first element 1.

Now, a force between the first and the second element 1 and 2 is induced by applying a temperature difference between the two elements 1 and 2. The temperature and density of air/gas particles in particular in the gap between the elements 1 and 2 adjust in a way that attractive or repulsive forces are generated, depending on the temperature difference, which effect is described in the "Passian et. al". documents.

Elements 1 or 2 can e.g. consist of silicon or silicon nitride. Preferred gas between the elements can e.g. be air or N∥A temperature range for e.g. heating one of the elements can be between room temperature and 100° Celsius.

According to FIG. 1, the first element 1 shows a temperature T1 and the second element 2 shows a different temperature T2. T3 denotes the temperature of the gas, which is conveniently air, distant from the elements 1, 2, and TG denotes the temperature of the gas in the gap between the elements 1 and 2 wherein the temperature TG is not constant in the gap but dependent from a distance from the elements 1 and 2.

The way the temperatures T1 and/or T2 are generated is not subject to the present consideration but will be discussed in more detail in connection with other embodiments of the invention below.

In case the temperature T1 of the first element 1 is below the temperature T2 of the second element 2, then a repulsive thermal force is generated between the elements 1 and 2 making the elements 1, 2 repel each other. The gas temperature T3 is typically equal or below the temperature T1 of the first element. At least one of the temperatures T1, T2 or T3 is controlled in order to comply with the temperature relations as introduced. For example, the temperature of the first element T1 and the gas temperature T3 are not controlled and thus take ambient temperature. Then the temperature T2 of the second element 2 is actively controlled by a suitable actuator, i.e. a heater, in order to heat the temperature T2 of the second element 2 to a temperature T2 above the temperature T1 of the first element 1. In another embodiment, the temperature T2 of the second element 2 is not controlled. Then, the temperature T1 of the first element 1 is actively controlled to a temperature below the temperature T2 of the second element 2 by a suitable actuator, i.e. a cooler, in order to induce repulsive forces between the elements 1 and 2.

In order to induce attractive forces, the temperature T1 of the first element 1 and the gas temperature T3 have to exceed the temperature T2 of the second element 2. For example, the temperature T1 of the first element 1 and the gas temperature T3 are not controlled and thus take ambient temperature. Then the temperature T2 of the second element 2 is actively controlled by a suitable actuator, i.e. a cooler, in order to cool the temperature T2 of the second element 2 to a temperature below the temperature T1 of the first element 1. In another embodiment, the temperature T2 of the second element 2 is not controlled and thus takes ambient temperature. Then, the temperature T1 of the first element 1 is actively controlled to a temperature above the temperature T2 of the second element 2 by a suitable actuator, i.e. a heater, in order to induce attractive forces between the elements 1 and 2.

In case only one of the temperatures T1 or T2 is controlled the actuator for controlling such temperature preferably measures ambient temperature as a reference for actively heating or cooling the respective element below or above such ambient temperature provided the microsystem follows the assumption that the temperature of the element that is not controlled takes ambient temperature in a timely manner. In more sophisticated systems, the actuator might comprise a sensor for measuring the temperature of the non temperature controlled element. Such actuator might further comprise control loop means for maintaining the controlled element at a predefined and adjustable temperature. Such actuator might comprise means for continuously or intermittently heating or cooling the element in a controlled fashion.

Of course, the temperatures T1 and T2 of both elements 1 and 2 can be actively controlled as can additionally be the temperature T3 of the gas.

For classifying the forces, in an experiment the force between the first and the second element 1 and 2 were measured. FIG. 2 a) shows the transient behavior of the heat induced force—the second element was heated with respect to the temperature of the first element and this temperature gradient was held at a constant level—as a function of the separation distance d between the two facing surfaces of the elements.

At a constant distance d, the force measured depends approximately linearly on the temperature difference between the temperature T2 of the second element 2 and the temperature T1 of the first element 1 which temperature is also the temperature T3 of the gas which was room temperature in this setup. Here, the force is measured at a constant distance d of about 500 nm between the surfaces s1 and s2.

The value of the measured force divided by the temperature difference and the area is of the order of 10 N/(K m^2) at a separation of 1 micrometer. This value typically also depends on the materials involved.

Thermally induced forces acting on elements of a microsystem including one of the elements being a movable unattached element show multiple benefits: First of all, the microsystem as proposed is simple to manufacture. Standard microfabrication techniques can be used. There is large freedom of choice of the properties of the movable element. Further, no mechanical or electrical contact is needed for movable element. Generation of attractive and repulsive forces are possible. No high voltages are needed. Thermal actuators are easy to integrate into a microsystem. The forces induced are distance dependent. A transient behavior with decay length of the order of some micrometers can be observed. In combination with a second force such as a spring, gravity, electrostatic attraction etc., one can control the distance. The microsystem as proposed can work power efficient because the thermal capacity of micrometer-sized body is relatively small. Any positioning of the second element with respect to the first element can be done fast: Experimental data show a response time below 10 microseconds. In many applications, the heater response time might be the limiting factor. A temperature difference between the two elements needed to induce the forces is relatively easy to produce in an accurate and reproducible way. In contrast to the temperature difference, however, the effect is not expected to depend strongly on the absolute temperature and pressure, which can be allowed to drift.

FIG. 3 shows several embodiments of microsystems in cross-sectional views. In FIGS. 3 $a$) and 3 $b$) two embodiments of microlifters are illustrated. The static element 1 faces several second elements 2 which several second elements 2 can be separated from each other and thus form multiple second elements 2 each being movable and unattached, or can form one single second element being movable and unattached, e.g. by forming a grid which interacts with the first element 1 only in selected areas shown in cross section in FIG. 3 $a$). The second elements 2 face noses 18 of the first element 1.

FIG. 3 $a$) as all the subfigures of FIG. 3 show the microsystem in an operation mode i.e. the actuator is acting on one of the first and/or the second element 1, 2. A repulsive force is generated between the first and the second element 1 and 2 such that in the operating mode a gap called repulsive force gap 8 is generated due to the repulsive force thermally induced due to the temperature gradient between the first and the second element 1 and 2. Note, that in the microsystems according to FIG. 3 the repulsive force is at least partly counteracting gravity due to the setup of the system.

The repulsive forces acting on the microsystem according to FIG. 3 $a$) are generated by actuator entities 31 which together form actuator 3. These actuating entities 31 are heaters for heating the second elements 2. The first element 1 shows room temperature as does the surrounding gas. The actuating entities 31 are mounted on the first element 1 via spacers 19. As the actuating entities 31 are designed to heat the second elements 2 to a temperature higher than the temperature of the first element 1 it is preferred to thermally insulate the actuating entities 31 from the first element 1. In the present example, the spacers 19 can additionally serve as thermal insulators. Moreover, an insulating gap 9 is designed in the microsystem between actuating entity 31 and first element 1.

Reference number 7 indicates a heat transfer gap between the actuating entity 31 and the second element 2. Heat is transferred from the actuating entity 31 via this heat transfer gap 7 to the second element 2. However, the force is then acting via the repulsive force gap 8 between the first and the second element 1 and 2.

FIG. 3 $b$) shows a microsystem in form of a microlifter or micropositioner similar to the one introduced in FIG. 3 $a$). However, the second element 2 is a continuous element 1 facing several noses 18 of the first element 1 via repulsive force gaps 8. The actuating entities 31 now transfer heat not from the face sides of the second element 2 but from underneath. The actuating entities 31 are still mounted on the first element 1 including some thermal insulating means. This arrangement makes heat transfer gaps 7 interchange with repulsive force gaps 8 along the surface s2 of the second element 2. As can be derived in particular from this embodiment, it is absolutely not needed to heat or cool the entire first or second element 1, 2. Heating or cooling single spots—also referred to as temperature controlled zones in the following—might be sufficient to actuate the second element 2 with respect to the first element 1. Depending on the structure of the elements 1, 2, actuating temperature controlled zones can be preferred over heating or cooling the entire element.

Summarizing the embodiments according to FIGS. 3 $a$) and 3 $b$), these microsystems are designed for lifting and/or positioning of movable elements 2. With these microsystems and the second element 2 can be caused to float above a surface. Actuating entities 31 can also act as bumpers—i.e. stabilizing means—for the second element 2 in case of undesired lateral movement of the second element 2 according to FIG. 3 $a$), or as support for second element 2 in the silent mode according to FIG. 3 $b$). In order to overcome adhesion and in order to induce the temperature difference, it is preferred to reduce the contact area between the movable element 2 and the static element 1, for example by putting tips on one of the two facing surfaces. The various areas and distances have to be adjusted so that an attractive force at the area of the heat transfer is smaller than the desired repulsive force for lifting the second element 2. The actuator 3 can be included in the static substrate element 1. Some kind of thermal insulation between heater and the areas which are supposed to be colder than the movable part 2 is preferred. One advantage of such a lifting technique is the transient behavior of the force induced which sets a natural limit for the lifting process.

In accordance with the present invention, in FIG. 3 $d$) to 3 $g$) further microsystems are presented, all of them in cross-sectional view. According to FIG. 3 $c$), the heating can also be performed by radiation. In this example, again second element 2 is heated versus first element 1, which surfaces s1 and s2 of these elements 1 and 2 face each other. Radiation is implemented such that the entire second element 2 is heated. However, by focussing a radiation beam, also only a limited zone of element 2 could be temperature controlled.

The embodiments in FIG. 3 $d$) to 3 $g$) show microsystems for micro-/nanopositioning. In FIG. 3 $d$) the elements 1 and 2 face each other with surfaces s1 and s2. In the operation mode as well as in the silent mode in which the actuator is switched off the facing surfaces s1 and s2 are aligned to each other in parallel. This makes the thermal forces act perpendicular to the surfaces s1 and s2 as the arrow in z-direction—also referred to as vertical direction—indicates. The mircosystem receives a force only upwards—which is in z-direction—such that the second element 2 is lifted in z-direction with respect to the first element 1.

In FIG. 3 $d$), the first element 1 provides a support 17 which is a holding structure for holding the second element 2 during a silent mode. Typically, the free and unattached element 2 is borne by the holder 17 as long as the actuator—which is not explicitly shown in most of the figures—is not operated.

Generally, the thermal force acts perpendicular on the facing surfaces of the elements. By introducing an angle between facing surface sections a force component in x-direction can be induced—which is parallel to the surface according to this coordinate system—at the same time with a component in z-direction—which is perpendicular to the surface. x- and y-direction are covered by the term lateral direction. According to the microsystem of FIG. 3 *e*), the surface s2 of the second element 2 provides three sections s21, s22 and s23 inclined towards the facing surface s1 of the other element 1. These sections s21, s22, s23 are aligned in parallel to each other and form a saw tooth profile. Following the rule that thermally induced forces act perpendicular on the facing surfaces of the elements, now a force is generated lifting the second element 2 up- and sidewards according to the arrow, consequently having a z- and an x-component. Thus, the second element 2 is lifted and shifted sidewards with respect to the first static element 1. Note that it is still the entire second element 2 being heated in order to generate a repulsive force.

According to FIG. 3 *f*), the saw tooth profile is now arranged in the first static element 1. The surface s1 of the first element 1 comprises inclined sections s11, s12 and s13 for inducing a force perpendicular to the inclined surface sections s11, s12 and s13. The second element 2 is heated.

The saw tooth profile is in particular beneficial as in a best case the entire surface of an element can be used effectively while keeping a low distance to the facing element with all sections of such surface. Instead, providing an entirely inclined surface s1 without separating into multiple inclined sections in saw tooth profile would consequently provide at least a part of the surface remote from the facing surface and thus not being effective in inducing thermal forces.

According to FIG. 3 *g*), there is introduced a microsystem comprising in the surface s1 of the first element 1: a first inclined section s14, another parallel section s15, and a further inclined section s16. The inclined surface sections s14 and s16 face each other and are mirrored at plane p perpendicular to surface s2. Provided the facing element 2 is heated entirely, the surface arrangement in element 1 induces three different forces as indicated by the arrows, each section s14, s15, s16 of the surface s1 being responsible for one of the forces. When comparing the forces induced by means of the sections s14, s15, s16 and the heated element 2, the section s15 will induce a force portion of higher magnitude than the other sections s14 and s16 since its effective area is bigger, however, its bigger distance to the facing surface s2 might eliminate some of the effectiveness achieved by the big area. Overall, due to the arrangement of element 1, the microsystem provides a second element 2 which can be stabilized in its lifted position—such as illustrated in FIG. 3*g*)—due to the existence of forces comprising a lateral component: If element 2 moves out of the stabilized position, e.g. Laterally to the right, then inclined section s16 becomes more effective as for inducing a lateral force onto the second element 2 than section s14. Hence a force in direction of the desired/stabilized position—also called equilibrium state—is induced and makes the element 2 move to the left again. If element 2 is in its stabilized position, the lateral force components induced by inclined surface sections s14 and s16 cancel out.

In this context, it is emphasized that the magnitude of a force induced in a particular direction can also be varied by a concept of switching on or off actuating entities. In case of a mircosystem according to FIG. 3 *d*), no orientation selective force adjustment can be performed, however, provided that now not the entire element 2 is heated but only the very ends of this element 2 are temperature controlled zones, heating some more zones in the middle of element 2 can increase the magnitude of the resulting force induced. Transforming this insight to more complex microsystems having sections of inclined surfaces and parallel sections, multiple punctual heating of at least one of the first and the second element can adjust the overall magnitude as well as the overall orientation of a force induced.

Making use of the difference in thermal conductivity between a solid bulk and air, a stick-slip-motion of the second element 2 can be provoked. FIG. 4 *a*)-*c*) show three different positions of a micropositioner performing such stick-slip-motion, again in a cross-sectional view. As before, reference number 1 denotes the first element comprising bulk and reference number 2 denotes the second, movable and unattached element. The actuator 3 is mounted on the first element 1 and is embodied as a heater. The second element 2 comprises tips 21 at its ends which tips in this embodiment are not considered to induce lateral forces of noticeable magnitude. Consequently, such tips 21 only have a small effective surface. The tips 21 are preferred means to overcome adhesive effects one could observe when trying to lift off element 2 from element 1 when element 2 overlies element 1 with a major part of the facing surfaces. However, even if the tips 21 are big enough to induce noticeable lateral forces, due to the symmetry of element 2 and due to the arrangement of the actuator 3 thereby primarily transferring heat to a limited zone of movable element 2 opposite the actuator 3 there will be no lateral movement observed.

According to FIG. 4 *a*), in the heating phase the actuator 3 is heated up and also is the movable element 2. During heating the first element 1 is hotter than the movable element 2 due to the arrangement of the actuator 3 on the first element 1 without any further insulating means. As a result, an attractive force occurs between the first element 1 and the second element 2.

According to FIG. 4 *b*), when the heating is switched off suddenly, the first element 1 and the actuator 3 are cooled more effectively through the bulk of element 1 than element 2 can. Hence, the movable element 2 is hotter and a repulsive force occurs lifting the movable element 2 off the surface of element 1. After a short while, the movable element 2 is cooled off and there is no repulsive force any longer. The movable element 2 falls back into contact with the static element 1, as shown in FIG. 4 *c*).

When structures similar to FIG. 3 *d*) or 3 *e*) are introduced, also an x-motion can be induced. Such saw tooth profile structures are then preferably arranged in an actuation zone of element 2 of the microsystem according to FIG. 4 which actuation zone is an area in element 2 being exposed to the thermal radiation of actuator 3.

As already indicated, for inducing additional lateral forces inclined surfaces are preferably arranged in a saw tooth like profile in order to increase the effective inclined surface of an element. Each of such saw tooth structure in profile is also referred to as ramp in the following. A ramp is a structure embodied in one or both of the elements comprising a rising and a falling surface section. A ramp is shown in profile in FIG. 5 *c*). The rising surface section srs typically shows only slight inclination angle of $0° < \gamma < 45°$, while the falling surface section sfl shows a steep inclination of $75° < \kappa = 90°$. The inclination angle $\gamma$ of the rising surface section srs determines the lateral component of the force to be established and is chosen accordingly. The falling surface section sfl preferably shows an inclination angle $\kappa$ of 90° such that ts does not contribute in generating any force on the second element. Hence, the effective surface for inducing lateral components of forces induced by the rising surface sections can be maximized. A ramp can be attached to the respective element or can be integral part of such element. For the latter, any manufacturing process for manufacturing such element includes process steps for generating such ramps. This teaching can also be applied to any structure arranged on or in elements which structures can be used for inducing non-vertical force components.

FIGS. 5 a) and b) show two different microsystems comprising ramps, both in top view and cross-sectional view. Such microsystems can also be characterized as thermal spring systems or as self positioning systems.

FIG. 5 a) shows a first element 1 comprising a set of four ramps 11—also referred to as first ramps 11 in the following—in profile forming the saw tooth profile, while the second picture in FIG. 5 a) shows the same element in top view. While the structure is introduced as an independent element, it is preferred that such structure forms part of a more complex element. No second element is shown in FIG. 5 a). An element designed like the element 1 of FIG. 5 a) which faces another element with its ramps causes not only a vertical force component but also a lateral force component. The orientation of such lateral force component is indicated by the arrow, as will be in all the following illustrations.

The idea of a structure which induces a lateral force component can also be extended to build a microsystem device which brings or holds a body to or in a desired position. Such mircosystem then can also provide self centering capabilities. According to the top view of a microsystem according to FIG. 5 b), two sets of ramps are arranged on the first element 1. Each set of ramps comprises four ramps. As can be derived from the cross-sectional view of the microsystem along the line a-a', the first ramps 11 show different orientation than the second ramps 12. A second ramp 12 is generally oriented on the element in a 180° degree rotated position with respect to the first ramp 11. The entire surface structure of the first element 1 in FIG. 5 b) follows an alignment a1 which comprises a first and a second subalignment a11 and a12. The first subalignment a11 comprises the set of first ramps 11 while the second subalignment a12 comprises the set of second ramps 12. In between the subalignments a11 and a12, there is an intermediary zone iz1 being free of ramps and comprising a surface section parallel to the surface of the second element 2.

For implementing self-positioning properties of element 2, the two subalignments a11 and a12 comprising the respective sets of ramps 11 and 12 are used to produce lateral forces in opposite directions. The rising surfaces of the first and second ramps 11 and 12 face. However, first and second subalignments a11 and a12 with their respective sets of ramps can also be interchanged such that falling surfaces of the first ramps 11 face falling surfaces of the second ramps 12. However, then there is no longer a self-centering effect.

The movable element 2 is floated by means of the normal component of the thermally induced forces. In the desired lateral position the lateral force components induced by the two sets of ramps 11 and 12 cancel each other out. Once the movable element 2 shifts to a different lateral position, a restoring lateral force arises centering the second element 2 on x-position xg.

By bringing the two end sections of second element 2 to different temperatures one can shift the rest position and combine the centering properties of the microsystem with scanning properties.

Additional heaters and areas with sow-teeth-like ramps or even sets of ramps can be introduced which produce force in +y and −y direction. In general, a ramp oriented in a way that it causes a force component into +y direction is called a third ramp. Such third ramp is oriented in a 90° degree rotated position with respect to the first ramp. Another ramp oriented in a way that it causes a force component into −y direction is called a fourth ramp. Such fourth ramp is oriented in a 270° degree rotated position with respect to the first ramp.

With such structures a xy-scanner can be built: For example, a first ramp—or even better a set of first ramps—which induces a force in +x direction is arranged at both ends of the movable element, and also a second ramp—or even better a set of second ramps—is arranged at the same both ends which second ramp induces a force in −x direction. Then motions/forces can be induced in:

z-direction by heating the first and second ramps at the same time;

+x-direction by heating the first ramps at the same time; and

−x-direction by heating the second ramps at the same time.

Similarly, the y-direction can be addressed: By arranging a third ramp—or even better a set of third ramps—which induces a force in +y direction at the other both ends of the movable element, and also a fourth ramp—or even better a set of fourth ramps—at the same other both ends which second ramp induces a force in −y direction. Then motions/forces can be induced in:

z-direction by heating the third and fourth ramps at the same time, preferably in addition to the first and second ramps;

+y-direction by heating the third ramps at the same time; and

−y-direction by heating the fourth ramps at the same time.

Note, that by choosing the right ratio between heating the first and second ramps, ideally the driving force in x-direction can be tuned. Hence, the resulting velocity can be tuned. This is of course also true for the third and fourth ramps supporting control of movements in +y and −y direction.

Figure 9:
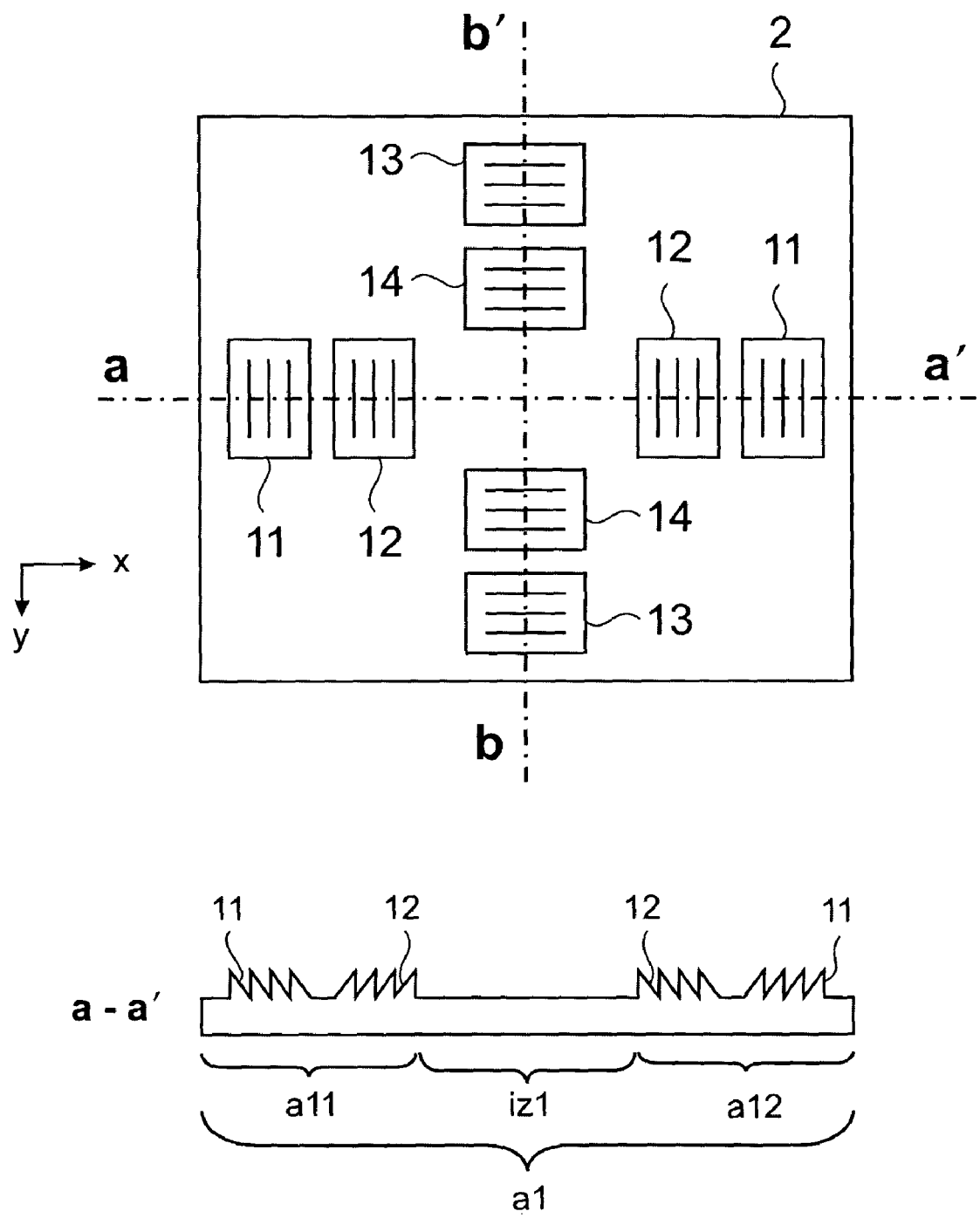

The second, movable element of such xy-scanner is shown in FIG. 9 in top view first, and then followed by a cross sectional view according to line a-a'. Consistently with the preceding figures, first ramps are denoted by 11, second ramps by 12, third ramps by 13 and fourth ramps by 14. On this second element 2 always four ramps of the same orientation are grouped into a set. Sets of first and second ramps 11 and 12 form a first and second subalignment a11 and a12 of an alignment a1. Although not explicitly shown, the cross-section along line b-b' looks identical to the cross-section along the line a-a', however first ramps 11 are replaced by third ramps 13 and second ramps 12 are replaced by fourth ramps 14.

Using the same argumentation, a rotational movement can be induced also.

Figure 6:
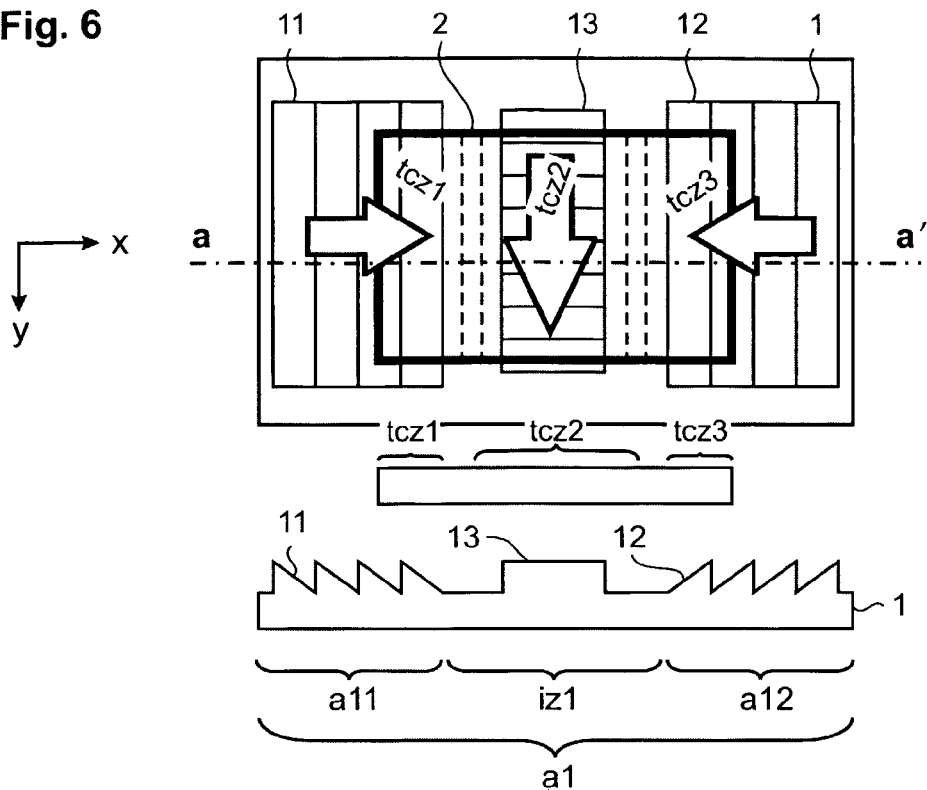

Combining the idea of centering the movable element 2 with the idea of scanning—i.e. controlled lateral movement—a guiding structure can be created. Such microsystem is provided with a thermal guiding structure and can also be viewed as a micro-conveyer. FIG. 6 shows a thermal guiding microsystem in top view and cross-section. Here, the microsystem known from FIG. 5 b) is extended by arranging a set of third ramps 13 on the first element 1 in addition to the sets of first ramps 11 and of second ramps 12. The second element 2 is only depicted in its contour for visibility purposes. The arrows again indicate the direction of lateral force components induced by the respective sets of ramps when acting together with the thermally actuated movable second element 2. In this embodiment, the alignment a1 of structures on the first element 1 comprises a first subalignment a11 comprising the set of four times first ramps 11, a second subalignment a12 comprising the set of four times second ramps 12, and an intermediary zone iz1 in between the first and the second subalignment a11 and a12. The intermediary zone iz1 in this embodiment is not free of ramps but comprises a set of eight times third ramps 13.

As the second element 2 is the element heat is exerted on by an actuator not shown, it is preferred to enable selective actuation of different zones in element 2 in order to selectively control the positioning of element 2. As indicated in FIG. 6, there are preferably provided three temperature controlled zones tcz1, tcz2 and tcz3 which are thermally isolated from each other. Starting from a position of the second element 2 as shown in FIG. 6, a movement of the element 2 can be induced in +y direction when radiating temperature controlled zone tcz 2 as this temperature controlled zone tcz 2 acts together with the set of third ramps as actuation zone. Temperature controlled zone tcz 1 acts together with the set of first ramps 11 as actuation zone and temperature controlled zone tcz2 acts together with the set of second ramps 12 as actuation zone.

In this microsystem, the movable element 2 could be held at a given x-position whilst a motion in y-direction can be induced.

Figure 7:
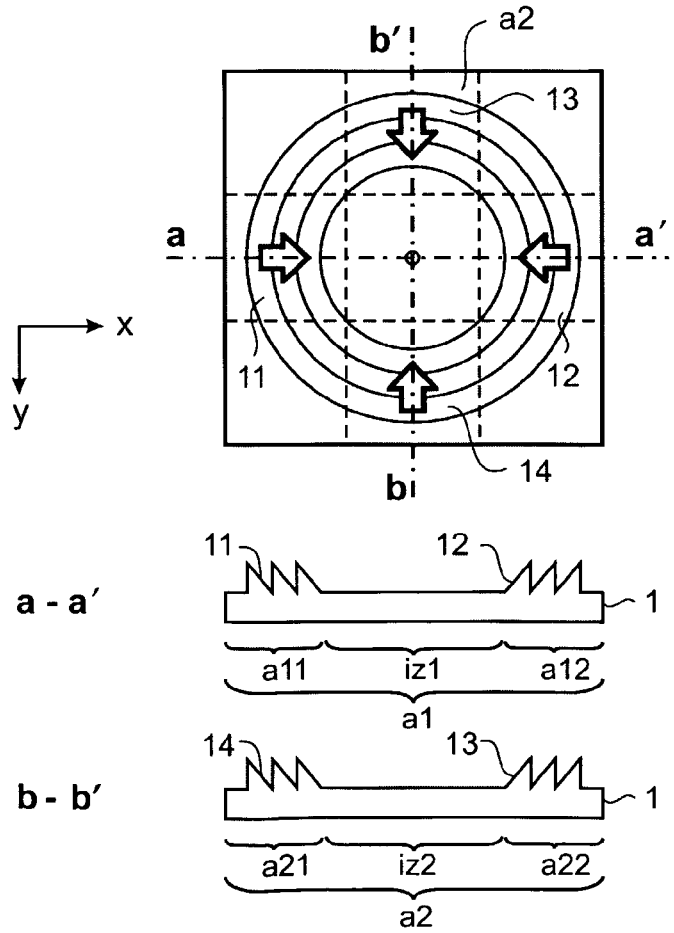

FIG. 7 illustrates a circular self-centering microsystem in top view and in cross-sectional view. The top view only shows the first element 1 comprising four sets of ramps 11, 12, 13 and 14 which ramps are connected and form a circular ramp arrangement. Although the ramps of different orientation are connected with each other, it is justified to talk about sets of ramps of different orientation as in particular zones of the first element 1 these ramps show the orientation of first, second, third or fourth ramps 11, 12, 13 and 14. Again, the arrows indicate the orientation of lateral force components generated by the respective ramps. There is also an understanding of alignments of ramps in this embodiment: In a first alignment a1, a first subalignment a11 comprises the set of first ramps 11 and a second subalignment a12 comprises the set of second ramps 12. The intermediary zone iz1 is arranged between the first and second subalignment a11 and a12. In a second alignment a2, a third subalignment a21 comprises the set of third ramps 13 and a fourth subalignment a22 comprises the set of fourth ramps 14. The intermediary zone iz2 is arranged between the third and fourth subalignment a21 and a22. The two intermediary zones iz1 and iz2 intersect. The cross-sectional views are taken along lines a-a' and b-b'.

For the purpose of clarity, the second element 2 is not shown in all different views of the microsystem in FIG. 7. However, it is anticipated to provide the second element 2 with a plain surface facing the first element 1. The second element 2 can be of circular or any other shape. In a first embodiment, it is understood that the entire movable element 2 is heated during actuation. In this mode, the microsystem self-centers movable element 2 over the center point o of the first element 1. However, in other embodiments, different zones of element 2 might be heated separate from each other such that by means of selectively inducing heat into such temperature controlled zones element 2 can be steered into one or the other lateral direction x or y.

Such microsystem generating a restoring force can be considered as a spring system. Such microsystem can be used for measurements of external forces. Its advantage clearly is that the probing element 2 does not have to be in mechanical contact with the first element 1.

Figure 8:
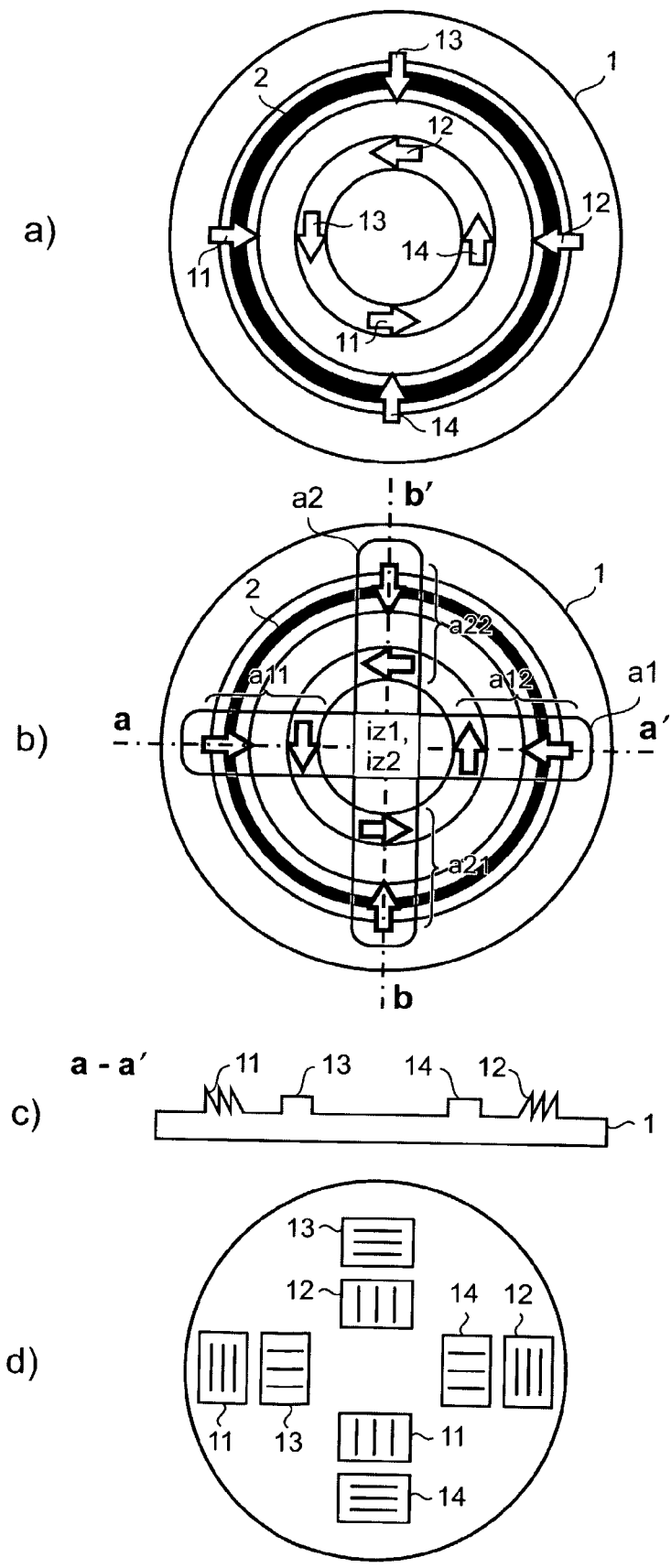

The embodiment according to FIG. 8 shows a microsystem including properties of a self-aligning rotator or a thermal bearing in two schematic top views according to FIGS. 8a) and 8b), in a cross-sectional view according to FIG. 8c), and in a top view according to FIG. 8d). Again, the second element 2 is just shown in its contour for visibility purposes. In the concept of ramp alignments on the first element 1, there is a first alignment a1 comprising a first subalignment a11 which in turn comprises a set o first ramps 11 and a set of third ramps 13, and a second subalignment a12 which in turn comprises a set of second ramps 12 and a set of fourth ramps 14. An intermediary zone iz1 is arranged between the first and second subalignment a11 and a12. In a second alignment a2, a third subalignment a21 comprises a set of third ramps 13 and a set of second ramps 12, and a fourth subalignment a22 comprises a set of fourth ramps 12 and a set of first ramps 11. An intermediary zone iz2 is arranged between the third and fourth subalignment a21 and a22. The two intermediary zones iz1 and iz2 intersect. The cross-sectional view is taken along the line a-a'.

In this microsystem, the second element 2—which e.g. is a disk—is self centered by means of the outer sets of ramps 11, 12, 13 and 14 and rotates by means of the inner sets of ramps 11, 12, 13 and 14 provided the entire second element 2 is heated. There is no need for an additional bearing. The disk is free and unattached.

From the embodiment illustrated in FIG. 8, it can be derived that, within an alignment, ramps can be aligned in line with an axis of the alignment which axis is a-a' and b-b' for the two alignments a1 and a2. For example, in the first alignment a11, the ramps 11 and 12 are in line with the axis a-a', while the ramps 13 and 14 of this alignment a1 are oriented perpendicular to the axis a-a'.

In other embodiments based on the microsystem according to FIG. 8, selected zones of the second element 2 can be individually controlled in temperature such that controlled lateral and rotational movements of the disk can be provoked.

Instead of providing at least four set of ramps aligned as illustrated in FIGS. 7-9, there can also be provided at minimum three ramps or corresponding three set of ramps being aligned to each other in substantially 120° degree positions. With such orientation of the ramps/set of ramps, self-centering devices can be built as well as scanners and rotational devices, eventually by applying additional ramps in such alignment as taught in connection with the devices according to FIGS. 7-9.

Computer readable program code or program code in the present context mean any expression, in any language, code or notation, of a set of instructions intended to cause a system having an information processing capability to perform a particular function either directly or after either or both of the following a) conversion to another language, code or notation; b) reproduction in a different material form.

While the invention has been described with reference to exemplary embodiments, it will be understood by those skilled in the art that various changes may be made and equivalents may be substituted for elements thereof without departing from the scope of the invention.

REFERENCES 1 first element
11 first ramp
12 second ramp
13 third ramp
14 fourth ramp
17 support
18 nose
19 spacer
2 second element
21 tip
3 actuator 31 actuating entity
7 heat transfer gap
8 repulsive force gap
9 insulating gap
d distance
s surface
a1, a2 alignment
a11, a12, a21, a22 subalignment
iz1, iz2 intermediary zone
tcz1, tcz2, tcz3 temperature controlled zone

The invention claimed is:

1. A microsystem, comprising:
a first static element,
a second, movable and unattached element,
an actuator for effecting a repulsive force between the first and the second element to effect contactless movement of the second element relative to the first element, which actuator is designed for controlling a temperature of one of the first element and the second element.

2. The microsystem according to claim 1, comprising a distance (d) between the first element and the second element smaller than 100 μm in an operation mode in which operation mode the actuator is operated.

3. The microsystem according to claim 1 wherein surfaces (s1, s2) of the elements facing each other are aligned in parallel.

4. The microsystem according to claim 3 wherein one of the surfaces of the elements facing each other comprises at least a section inclined towards the other surface.

5. The microsystem according to claim 4, wherein the surface comprises another section aligned in parallel to the other surface.

6. The microsystem according to claim 4, wherein the surface comprises a further section inclined towards the other surface.

7. The microsystem according to claim 6, the further surface section being arranged in the corresponding element by mirroring the inclined surface section at a plane normal to the other surface.

8. The microsystem according to claim 1, one of the first and the second element comprising a first ramp facing the other element.

9. The microsystem according to claim 8, comprising a second ramp oriented on the element in a 180° degree rotated position with respect to the first ramp.

10. The microsystem according to claim 9, comprising a third ramp oriented on the element in a 90° degree rotated position with respect to the first ramp.

11. The microsystem according to claim 10, comprising a fourth ramp oriented on the element in a 270° degree rotated position with respect to the first ramp.

12. The microsystem according to claim 9, comprising a first alignment comprising the first ramp and the second ramp and an intermediary zone between the first ramp and the second ramp.

13. The microsystem according to claim 11, comprising a second alignment comprising the third ramp and the fourth ramp and an intermediary zone between the third ramp and the fourth ramp.

14. The microsystem according to claim 12, the first alignment comprising a first subalignment comprising the first ramp and another ramp oriented according to the second ramp, and a second subalignment comprising the second ramp and another ramp oriented according to the first ramp, and the intermediary zone being arranged between the first and the second subalignment.

15. The microsystem according to claim 13, the second alignment comprising a third subalignment comprising the third ramp and another ramp oriented according to the fourth ramp, and a fourth subalignment comprising the fourth ramp and another ramp oriented according to the third ramp, and the intermediary zone being arranged between the third and the fourth subalignment.

16. The microsystem according to claim 13, the first alignment comprising a first subalignment comprising the first ramp and another ramp oriented according to one of the third ramp and the fourth ramp, and a second subalignment comprising the second ramp and another ramp oriented according to one of the third ramp and the fourth ramp, and the intermediary zone being arranged between the first and the second subalignment.

17. The microsystem according to claim 13, the second alignment comprising a third subalignment comprising the third ramp and another ramp oriented according to one of the first ramp and the second ramp, and a fourth subalignment comprising the fourth ramp and another ramp oriented according to one of the first ramp and the second ramp, and the intermediary zone being arranged between the third and the fourth subalignment.

18. The microsystem according to claim 1, wherein the actuator is adapted to control the temperature of at least part of one of the first and the second element with respect to the temperature of the other of the first and the second element.

19. The microsystem of claim 1 wherein the actuator is mounted on the first element.

20. A micropositioner, comprising
a microsystem according to claim 1 for positioning the second element with respect to the first element.

21. A microlifter, comprising
a microsystem according to claim 1 for lifting the second element with respect to the first element.

22. A microscanner, comprising
a microsystem according to claim 1 for moving the second element with respect to the first element laterally.

23. A method for positioning a second element with respect to a first element in a microsystem, comprising steps of:
controlling a temperature of at least a part of one of the first element and the second element, which first element is a static element and which second element is a movable and unattached element, and thereby effecting a repulsive force between the first element and the second element for contactless positioning of the second element with respect to the first element.

24. A computer program product stored on a computer usable medium, comprising computer readable program code for causing a processing unit to perform all the steps of the method of claim 23.

* * * * *